United States Patent [19]

Fricke et al.

[11] 4,061,874
[45] Dec. 6, 1977

[54] SYSTEM FOR REPRODUCING SOUND INFORMATION

[76] Inventors: J. P. Fricke, Wullnerstrasse 100, Cologne; Ulrich R. Müller, Siegstrasse 2, Lovenich, both of Germany

[21] Appl. No.: 692,441

[22] Filed: June 3, 1976

[51] Int. Cl.² .................. H03G 3/20; H03G 9/18
[52] U.S. Cl. .................. 179/1 P; 330/134; 330/138
[58] Field of Search ........... 179/1 A, 1 AT, 1 MN, 179/1 N, 1 P, 15 AV; 333/18, 14; 325/424, 62; 330/126, 134, 138

[56] References Cited

U.S. PATENT DOCUMENTS

| 3,160,707 | 12/1964 | Meyers | 179/1 P |
| 3,241,066 | 3/1966 | Ligotky | 325/62 |
| 3,247,464 | 4/1966 | Morrison | 330/138 |
| 3,795,876 | 3/1974 | Takahashi | 325/62 |
| 3,895,322 | 7/1975 | Stewart | 333/14 |

Primary Examiner—Kathleen H. Claffy
Assistant Examiner—E. S. Kemeny
Attorney, Agent, or Firm—Flynn & Frishauf

[57] ABSTRACT

In an environment of acoustic noise, such as a car radio playing in traffic or engine noise, both the volume (AGC) and dynamic range (Compression) of the audio amplifier are controlled by a local ambient acoustic noise sensor, such that gain is increased and dynamic range decreased simultaneously with increased ambient noise.

8 Claims, 3 Drawing Figures

SYSTEM FOR REPRODUCING SOUND INFORMATION

The present invention relates to a system for reproducing sound information in an environment impaired by noise of varying level, as e.g. encountered in automobiles, airplanes, railway stations and so on.

It is known to produce a signal dependent directly or indirectly on the noise level, and use such signal for varying the volume of the audio reproduction. The noise-dependent control signal may be derived from a microphone placed to pick-up the environmental noise, a potentiometer coupled to the acceleration control of a car, a small alternator driven by a propeller, and from the dynamo or the ignition system of a car.

It is further known to emphasize the audio signal in a portion of its frequency band, where the noise is especially heavy.

It has been found that boosting the volume alone is not sufficient to provide for optimum performance of a sound reproducing system used in a noisy environment.

It is an object of the present invention to improve the perceptibility of the reproduced sound information.

SUBJECT MATTER OF THE PRESENT INVENTION

Briefly, the system for reproducing sound information comprises a signal compressor which boosts the average level of the audio signal in respect to the noise in the entire or a part of the frequency range occupied by the reproduced audio signal.

The system in accordance with the present invention is particularly well adapted to the characteristics of the human auditory sense, thus, music and speach are better discriminated over the noise.

Figure 1:
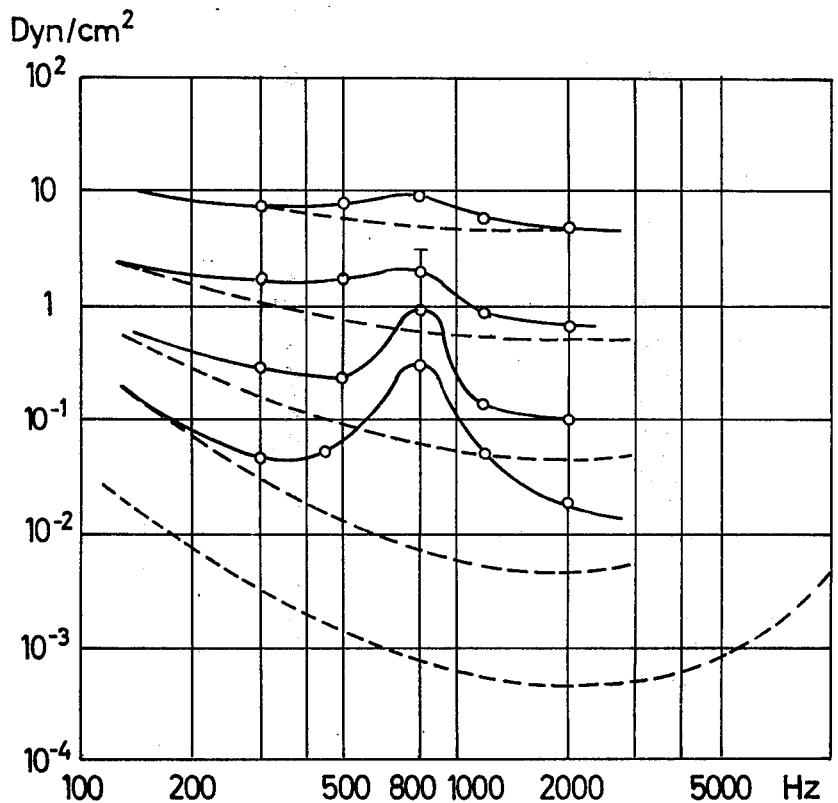
Figure 2:
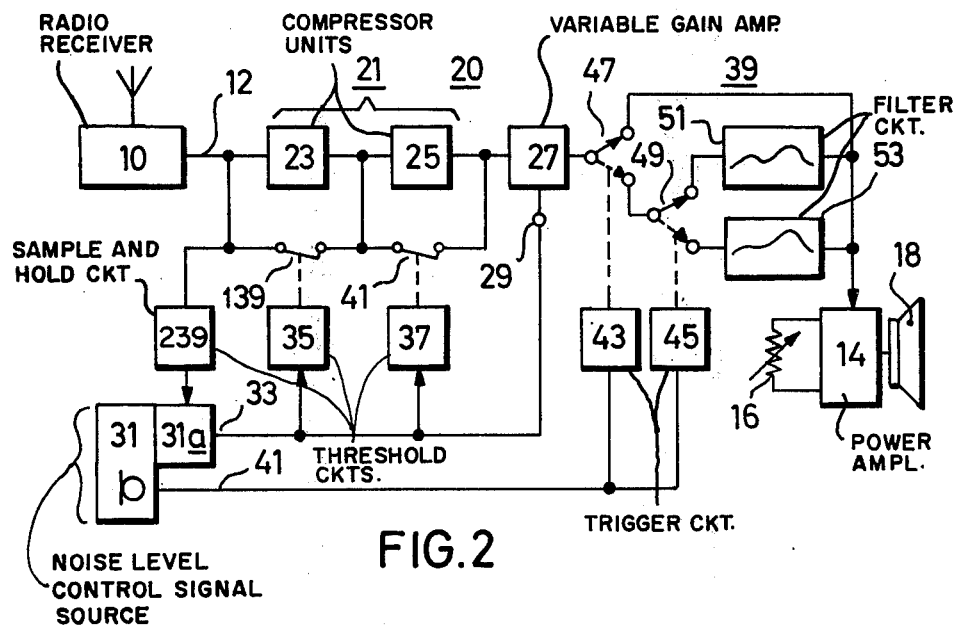
Figure 3:
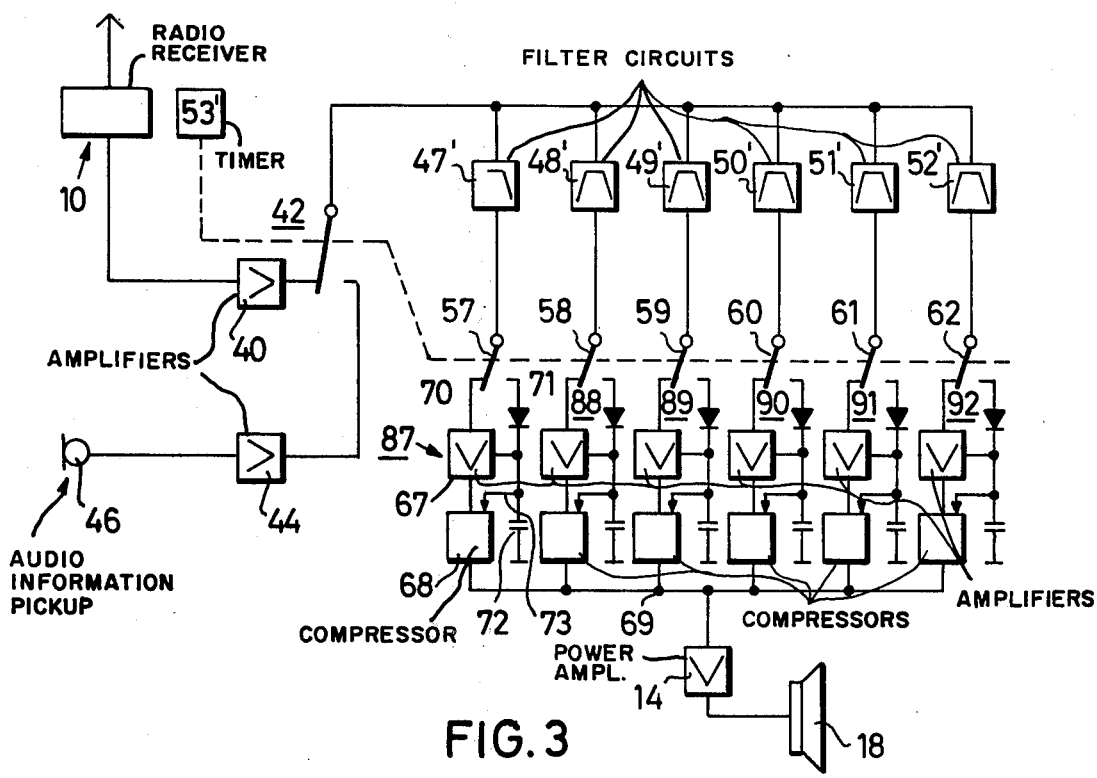

The invention will be described by way of example with reference to the accompanying drawings, wherein:

FIG. 1 is a graph of the frequency response of the human ear under noise and no-noise conditions; and FIGS. 2 and 3 are circuit diagrams, in block form, of typical embodiments of a sound reproducing system in accordance with the present invention.

In FIG. 1, where the horizontal axis corresponds to the sound frequency in hertz, and the vertical axis corresponds to the sound pressure in dyn cm$^{-2}$, both in a logarithmic scale, the broken curves show the frequency response of the human ear for different sound levels under no-noise conditions while the continuous curves show the frequency response of the human ear to different sound levels in presence of a spurious sound having a frequency of 800 hertz and a sound pressure as indicated by a vertical line. FIG. 1 shows clearly that the hearing threshold is appreciably raised in the vicinity of the 800 hertz spurious sound, and that the loudness curves are more crowded in this frequency range then the broken loudness curves which apply to the no-noise condition.

The invention takes into consideration this characteristic of the human ear and provides for a compression of the dynamic range of the audio signals, to compensate for the crowding of the loudness-curves in the presence of noise.

FIG. 2 shows a block circuit diagram of an audio system embodying the present invention. The embodiment shown in FIG. 2 takes the form of a radio receiver which may be used in an auto or car, in which the noise level may vary as a function of the speed of driving. The system of FIG. 2 includes a r.f. receiving section 10 coupled to an antenna and having an output terminal 12 at which a demodulated audio signal is provided. Further, the system comprises a power amplifier 14 provided with a volume control 16 and feeding a speaker 18. The output terminal 12 of the receiving section 10 is coupled to the input of the power amplifier 14 by circuit means 20 in which the invention proper is embodied. The circuit means 20 comprises signal compressor means which, in the embodiment shown, includes two compressor units 23, 25 connected in series in the signal path between the receiving section 10 and the power amplifier 14. This signal path further comprises a variable gain amplifier 27. The gain of the amplifier 27 can be controlled in known manner by a control signal applied to a control terminal 29 of the amplifier 27.

A control signal source 31 has an output terminal 33, at which a control signal is provided, which is a function of the noise level of the environment, in which the system of FIG. 2 is used. The control signal source 31 may be of any known type mentioned above. The control signal from the output terminal 33 is applied to the control terminal 29 of the amplifier 27 to vary the degree of amplification of the audio signals conveyed by the signal path from the receiving section 10 to the power amplifier 14 in such a manner that the signals are boosted in at least a portion of the frequency range occupied by the audio signal with increasing noise level. Preferably, the frequency response of the amplifier 27 is varied such that the audio signals are amplified more in those portions of the frequency range, in which the noise is concentrated, provided that the noise is not evenly distributed over the audio frequency band.

The control signal is further applied to first and second threshold circuits 35 and 37, respectively which are activated at different levels of the control signal representing the environmental noise level. The threshold circuits 35, 37 are connected to open normally closed switches 39, 41, respectively which are coupled across the compressor units 23, 25 respectively, as shown in FIG. 2. Each compressor unit provides for a given degree of signal compression and, thus, with increasing noise level at first the threshold circuit having the lower threshold, e.g. threshold circuit 35, is activated and opens switch 139 to connect the compressor unit 23 into the signal path between the receiving section 10 and the power amplifier 14. With further increasing noise level, threshold circuit 37 is actuated and activates compressor unit 25 by opening switch 41. Thus, the degree of signal compression is controlled in accordance with the noise level.

It will be appreciated that the system may comprise a single compressor unit or more than two compressor units without departing from the scope of the invention. Further, other means for controlling the compression of the signals in the signal path may be employed.

In a modification of the system as far as described, the control signal source 31 may comprise a sample and hold circuit 31a to allow an intermittent pick-up of a noise signal. This may be of advantage in cases, where the sound reproduced may interfere with the noise detection, e.g. if the control signal source comprises a microphone. In such cases, the control signal source may be activated temporarily during periods of time within which the reproduced sound is absent or of low level. Thus, the sample and hold circuit 31a may be connected for activation by a further threshold circuit 239 which has an input coupled to the output terminal 12 to receive the audio signal. The further threshold circuit 239 produces a sample signal when the audio signal is below a given low threshold value.

The system in accordance with the invention may comprise a plurality of signal path for different type of audio information, i.e. in a stereo system, and/or for different frequency bands of the same audio signal. A signal of the latter type may employ a plurality of control signals related to corresponding frequency ranges of the noise to provide for the signal boosting and/or signal compression selectively in those frequency ranges where the noise energy is concentrated.

The signal path or paths coupling the receiving section 10 to the power amplifier 14 may further comprise a frequency selective circuit 39 having a transfer function controlled by the control signal source 31. Thus, source 31 may include a microphone and producing a further signal on a line 41 which comprises information in respect to the frequency pattern of the environmental noise. The signal on line 41 is applied to two trigger circuits 43, 45 which respond to different frequency bands to actuate, in sequence, switching devices 47 and 49, respectively to couple filter circuits 51 and 53, respectively, into the signal path. Filter circuits have individual frequency response selected to boost the audio signal in those frequency ranges in which the noise is most heavy. Alternatively the switches 47, 49 may be controlled by threshold devices, e.g. by threshold circuits 35 and 37, respectively. Frequency selective circuit 39 may further be modified to comprise a plurality of passband filters tuned to adjacent portions of the audio frequency band, and each connected in series with a controlled gain amplifier. Each amplifier may receive an individual gain control signal from a frequency selective gain control signal source which responds to noise signal frequencies in the pass-band frequency range of the respective band filter. All gain control signal sources may be keyed by a common trigger circuit to sample the noise signal only when the audio signal amplitude is below a predetermined threshold value.

The embodiment shown schematically in FIG. 3 provides for a frequency-selective boosting of the power level of the audio signal in response to the frequency content of the noise signal. Thus, overloading of the ear is avoided in those frequency regions of the audio frequency range in which the noise power is especially great, since the signal peaks of the audio signal to be reproduced are reduced in these frequency regions and the dynamic variations of the sound reproduced on the basis of the audio signal are matched to the sensitivity of the ear for differences in loudness as modified by the noise.

In the system schematically shown in FIG. 3 a radio frequency receiving section 10 of a conventional radio receiver used in an noisy environment provides an audio signal to a booster amplifier stage 40. A one-pole-double-throw switching device (which may be an electronic switch) has one of its fixed contacts coupled to the output of amplifier stage 40. A second fixed contact of switch 42 is coupled to the output of an amplifier 44, having an input coupled to a microphone 46 arranged to pick-up the audio information, including noise, in the environment of the system.

Switch 42 further has a movable contact connected to the inputs of filter circuits 47' to 52'. Filter circuit 47 is a low pass filter having an upper frequency limit of 0.5 kHz. Filters 48' to 52' are band-pass filters having pass-band frequencies of 0.5 to 1 kHz, 1 to 2 kHz, 2 to 4 kHz, 4 to 8 kHz and 8 to 16 kHz, respectively. The band limits of the filter circuits abut each other without much overlapping each other. The outputs of the filter circuits 47' to 52' are individually applied to the movable contact of corresponding one-pole-double-throw switches 57 to 62, respectively.

The removable contacts of switches 57 to 62 are mechanically ganged and actuated together by a timer 53' as will be described in detail below.

The fixed contacts of each of the switches 57 to 62 are individually coupled to similar circuits 87 to 92, respectively, thus, it will be sufficient to describe circuit 87 coupled to the fixed contacts of switch 57.

In a normal, "reproducing" condition, shown in FIG. 3, the movable contact of switch 42 applies the audio signal output from amplifier stage 40 to the inputs of filter circuits 47' to 52', and the movable contact of switch 57 connects the output of filter circuit 47' to the input of a variable gain amplifier 67. Amplifier 67 has an output coupled to the input of compressor means 68 having an output coupled a output terminal 69 common to all circuits 87 to 92 and in turn connected to the input of a power amplifier 14 feeding a speaker 18.

Variable gain amplifier 67 further has a control input 70 to receive a signal controlling the gain of amplifier 67.

The other fixed terminal of switch 57 is connected to rectifier means, shown as a semiconductor diode 71, the other terminal of which being coupled to control input and to a first terminal of a capacitor 72 having its other terminal connected to circuit ground.

The connection between the diode 71 and the capacitor 72 is further coupled to a control input 73 of compressor means 68. Compressor means 68 may comprise a compressor stage, switching means for selectively short-circuiting the compressor stage, and a threshold circuit for actuating the switch, similar to components 23, 35 and 39 in FIG. 2. The compressor means 68 is activated (e.g. by opening of the associated switch), to compress the output signal of amplifier 67, when the control signal applied to its control input exceeds a predetermined threshold value. Variable gain amplifier 67 is arranged such that its gain raises with increasing control signal at control input 70.

During normal operation, the various switches have the position shown in FIG. 3 and the audio signal from the output of amplifier 40 is passed without essential modification to power amplifier 14 and reproduced by speaker 18.

Timer 53 is arranged to change the position of the switches 42, and 57 to 62 repeatedly for a short period of time, e.g. three milliseconds each say 2 to 32 seconds, this period of time being preferably adjustable, or controlled by the noise level to decrease with increasing noise level.

When the positions of the movable contacts are changed from the position shown in FIG. 3, the inputs of filters 47 to 52 are coupled to the output of microphone amplifier 44 and supplied with a signal representing solely the noise in the environment, since the reproduction of the sound is interrupted by switch 42. Simultaneously, the outputs of the filter circuits 47 to 52 are connected to the respective diodes (e.g. Diode 71), which rectify the noise signal and generate across the associated capacitor a voltage essential proportional to the noise level in the frequency band passed by the respective filter circuit. The voltage is maintained by the capacitor, thus, the switch 57, the diode 71, and the capacitor 73 form together with timer 53 a sample-and-hold circuit.

At the end of the three millisecond sampling period, the contacts are returned into the position shown in FIG. 3 and the sound reproduction continues with the variable gain amplifiers adjusted to gain levels corresponding to the noise levels in the frequency ranges which they amplify. Further, if the noise level in the respective frequency range, and, thus, the sampled voltage across the holding capacitor exceeds the threshold of the compressor means, the signal in the respective frequency band is compressed in addition to being boosted by the variable gain amplifier.

The variable gain amplifier in this and the previously described embodiments of the invention preferably raise the audio signal level in response to the noise level such that the audio sound pressure level is increased by 10 decibels for a noise level increase of 25 decibels. This corresponds to a level ratio of 10:4. Since a normal environment has a voice level of about 55 Phon, in which the subjectively pleasing audio level is to be controlled the level modification preferably starts about at this level.

In case of very heavy noise, the level ratio may be increased to 10:3. Overloading of the ear is avoided by such level reduction.

The circuit components represented in FIGS. 2 and 3 schematically by blocks may be of well-known type. The compressor units may comprise diode means connected to attenuate lower amplitude signal portions by a less degree than higher amplitude signal portions, or alternatively a regulated amplifier, the degree of amplification of which is controlled in dependence on its output signal level.

Various changes and modifications may be made in the described embodiments without departing from the scope of the invention.

What is claimed is:

1. A system for reproducing sound information in an environment impaired by noise of varying level, said system comprising:

A signal processing circuit having input means for receiving an input signal conveying audio information, output means for providing an output signal conveying processed audio information, and at least one signal path coupling said input and output means, said audio information occupying a given frequency band and having a given dynamic range; and a control signal source providing a control signal related to said noise level;

said signal path comprising amplifier means operative in at least a first portion of said frequency band to amplify said input signal, first means responsive to said control signal to vary the amplification provided by said amplifier means as a first direct function of said noise level, signal compressor means operative in at least a second portion of said frequency band, and second means responsive to said control signal to reduce the dynamic range of the signal in said at least second portion as a second direct function of said noise level, to provide an output signal which is boosted and dynamically compressed in at least a portion of said frequency band.

2. A system in accordance with claim 1 wherein said first and second frequency band portions comprise the same portion of the audio signal frequency band.

3. A system in accordance with claim 1 wherein said second means responsive to said control signal comprises at least one threshold circuit.

4. A system as claimed in claim 1 wherein at least one of said first and second means responsive to said control signal comprises a sample — and — hold circuit and means for momentarily sampling said noise level during a period of time within which said audio signal has an amplitude below a predetermined threshold value.

5. A system in accordinance with claim 4 wherein said control signal source comprises a microphone.

6. A system as claimed in claim 2 wherein said portion of the audio frequency band is that portion in which the noise is heavier than in other portions of the audio frequency band.

7. A system according to claim 1 wherein the audio signal is boosted by about 4 decibels for a noise level increase of 10 decibels.

8. A system as claimed in claim 7 wherein the boosting starts at a level of 55 Phons.

* * * * *